United States Patent [19]

Lin et al.

[11] 4,052,711

[45] Oct. 4, 1977

[54] BUBBLE LATTICE FILE USING MOVABLE FIXED LATTICE

[75] Inventors: Yeong S. Lin, Mount Kisco; Jackson E. Stanland, Somers, both of N.Y.

[73] Assignee: International Business Machines Corporation, Armonk, N.Y.

[21] Appl. No.: 537,798

[22] Filed: Dec. 31, 1974

[51] Int. Cl.² ............................................. G11C 19/08
[52] U.S. Cl. ................................................ 340/174 TF
[58] Field of Search ...................... 340/174 TF, 173 R

[56] References Cited

U.S. PATENT DOCUMENTS

| | | | |
|---|---|---|---|
| 3,683,307 | 8/1972 | Patterson | 338/99 |
| 3,913,079 | 10/1975 | Rosier | 340/174 TF |
| 3,930,244 | 12/1975 | Voegeli | 340/174 TF |
| 3,944,842 | 3/1976 | Dorleijn | 340/174 TF |

FOREIGN PATENT DOCUMENTS 7,110,674  2/1973  Netherlands ................... 340/174 TF

OTHER PUBLICATIONS

American Institute of Physics—AIP Conference Proceedings No. 5, Part 1, Nov. 16–19, 1971.

Primary Examiner—James W. Moffitt
Attorney, Agent, or Firm—Jackson E. Stanland

[57] ABSTRACT

A lattice file using magnetic bubble domains which are arranged in a regular lattice which is moved or expanded to allow different operations, without requiring the need for bubble domains to be entered into or removed from the lattice. This distinguishes from prior lattice files where new information is entered into the lattice and information to be read is removed from the lattice. In a first embodiment, the inherent stability of the lattice is utilized by providing high density lattice for storage and a relaxed (expanded) lattice for operations such as read and write. Thus, the spacings between the elements in the lattice are changed but their relative positions in the lattice are not changed. In a second embodiment, the lattice is shifted without substantially changing the inter-element spacing and information is written and read from bubble domains magnetostatically coupled to the lattice domains. In both embodiments, the lattice is retained so that elements do not have to be brought into and out of the lattice for the performance of memory and storage functions.

31 Claims, 18 Drawing Figures

| 90 | CONDUCTORS | TRANSFER 106 |
| --- | --- | --- |
| | | INSULATION 104 |
| | CONDUCTORS | READ/WRITE LAYER 102 |
| | | SENSING LAYER 100 |
| | INFORMATION LAYER | 98 |
| | | INSULATION 96 |
| | LATTICE LAYER | CONVEYOR 94 |
| | SUBSTRATE | SUBSTRATE 92 |

BUBBLE LATTICE FILE USING MOVABLE FIXED LATTICE

BACKGROUND OF THE INVENTION

1. Field of the Invention

This invention relates to lattice systems for storage of information, and more particularly to a lattice system using interactive elements where the lattice is expanded or shifted to provide various functions, without the need for taking elements from the lattice or putting elements into the lattice.

2. Description of the Prior Art

Lattice file systems have been described previously in copending application Ser. No. 395,336, filed Sept. 7, 1973 now abandoned. These lattice systems are characterized by extremely high density storage in which interactive elements are crowded closely together to provide high capacity, high density storage. Because the lattice is a regular arrangement of interactive elements, each of the elements has to be coded in order to represent information. For instance, magnetic bubble domain lattices are described in that application where the coding is generally in terms of the wall magnetization properties of the individual bubble domains. Thus, the lattice system can be used as an information handling system having very high density.

In the lattice system described in that copending application, information is written into the lattice by entering new bubble domains into the lattice. The read operation is performed by removing bubble domains from the lattice and then detecting the different properties of the individual elements. To improve the average access time for information in the lattice, a column accessing scheme has been described in copending application Ser. No. 429,601, filed Jan. 2, 1974. This column accessing scheme uses a plurality of input and output ports for removing information from the lattice and placing new information into the lattice. Thus, the bubble domain lattice can be shifted in one direction to bring a column of elements into the appropriate input/output channel, after which these elements are removed from the lattice in a direction transverse to the original shifting direction of elements within the lattice. In general, the average access time to any element in the lattice is improved by a factor related to the number of input and output ports provided. Again, this improved accessing scheme relies on putting elements into the lattice and removing them from the lattice.

As was mentioned previously, all positions in a lattice have to be filled in order that the lattice be stable. This means that individual elements in the lattice have to be coded if they are to represent information. In the case of magnetic bubble domain lattices, and systems using these lattices, various types of coding arrangements have been utilized, most of which rely on the different properties associated with the wall magnetization states of the bubble domains. Such different coding schemes are described in aforementioned Ser. No. 395,336 and are additionally described in copending application Ser. No. 375,285, filed June 29, 1973 (now U.S. Pat. No. 3,899,779) and copending application Ser. No. 375,289, also filed June 29, 1973 (now U.S. Pat. No. 3,890,605.) Another type of coding technique used in combination with the bubble domain lattice is exemplified by copending application Ser. No. 449,308, filed March 8, 1974, now U.S. Pat. No. 3,996,571. In this type of coding, the bubble domain lattice is used as a conveyor for information bubble domains in another magnetic medium, where the information bubble domains are magnetostatically coupled to the bubble domains in the lattice. The bubble domains in this other medium are the information carriers and they are coded in terms of presence/absence, as is conventionally done in bubble domain systems. Since the information bubbles are magnetically coupled to the lattice bubbles, movement of the lattice bubbles will cause movement of the information bubbles. Additionally, the information bubbles will have a density determined by the lattice bubbles so that high density storage is provided, without requiring the more complex coding techniques which are used when the lattice bubble domains are themselves coded.

The present invention provides a technique which overcomes problems associated with having to access interactive elements in a lattice. In the present technique, interactive elements do not have to be removed from the lattice and do not have to be entered into the lattice in order to provide the read/write functions. Additionally, block accessing of information can be obtained, or information can be obtained in a row by row fashion. This enhances the average access time for information. Also, the present technique relaxes margins which are placed on operations using a bubble domain lattice, since, as will be seen, many of the functions performed in lattice systems will be more easily performed because the lattice itself is relaxed. This may also aid in providing less coercivity since the movement of a plurality of bubble domains in a tightly packed array is no longer a requirement of the system. Additionally, different types of coding can be used in the present technique and multiple bubble domain layers can also be utilized.

Accordingly, it is a primary object of the present invention to provide an improved system using lattices of interactive elements, where the lattice can be maintained during the operation of such systems.

It is another object of this invention to provide a magnetic bubble domain lattice system, where a lattice of bubble domains is maintained while the spacings between bubble domains in the lattice is changed.

It is a further object of this invention to provide improved systems using lattices of interactive elements which have relaxed operational margins for the performance of various functions.

It is a still further object of the present invention to provide techniques for using lattices of interactive elements where the average access time for information is minimized, and in which block accessing can be provided.

It is another object of this invention to provide an improved lattice system using interactive elements, where different types of information coding can be easily used.

It is another object of the present invention to provide information handling systems using magnetic bubble domain lattices, where the inherent flexibility and stability of such lattices is directly utilized.

BRIEF SUMMARY OF THE INVENTION

In the present invention, lattices of interactive elements are provided in which the basic properties of the lattice are utilized to provide improved system operation. Incontrast with the prior art lattice systems where interactive elements are moved into and out of the lattice, the present invention seeks to maintain the lattice as such, but moves the lattice by either a shifting operation or an expansion/contraction operation, maintaining the lattice at all times. Thus, in the first embodiment, the lattice is shifted while maintaining approximately the same spacing between elements, while in a second embodiment, the spacings of the interactive elements are changed for the performance of various system functions. Therefore, high density storage can be obtained, while functions such as read/write can occur when the lattice is relaxed so that the individual elements in the lattice are almost isolated from one another. This means that these other operations, such as read and write, can be performed with improved bias margins and without requiring complex circuitry and tight operational tolerances.

In one embodiment using magnetic bubble domains as the interactive elements, information is retained in the form of coded bubble domains in a regular lattice arrangement. During storage, the bubble domains are maintained in a densely packed lattice, where the bubble-bubble spacing is, for example, approximately $1.35d$, where $d$ is the bubble domain diameter. When the lattice bubble domains are to be sensed, the lattice is expanded in either one or two dimensions so that the new lattice spacing is larger. For instance, a new lattice spacing of approximately $3d$ is suitable. However, the lattice is maintained during this expansion operation so that the relative positions of the domains with respect to one another is maintained in order to provide integrity of information storage. As is apparent, the lattice spacing when the lattice is relaxed (expansion) is such that the domains are almost isolated from one another, from the standpoint of their interactive effects. Thus, operations can be performed on the domains in this relaxed state more easily than when domains are tightly packed with respect to one another. The geometry and area of the components required for writing and reading are therefore relaxed from what they must be when these components are designed to detect closely packed bubble domains. Additionally, because the domains are now spaced quite far from one another, they can be directly sensed by the sensing array, without requiring that individual domains be removed from the lattice.

After sensing, the lattice is again contracted to its high density state to enable high density storage. If desired, bubble domains can be easily removed from the lattice while it is in its relaxed state, or any intermediate state between relaxed and contracted, and new information can be entered into the lattice. This is more easily achieved with less tight margins because the lattice is more relaxed and the bias field requirements, shift register design, etc., are therefore less stringent.

In the present system, bubble domains can be coded in any of the ways known in the prior art. For instance, techniques will be shown using bubble domains coded in terms of their wall magnetization, and also coded in terms of the presence and absence of such domains.

In a second embodiment, the bubble domain lattice is shifted without necessarily changing the inter-element spacing. A second bubble domain layer is provided which contains the information domains. Structure is provided for generating and annihilating domains in that information layer and also for sensing domains in the information layer. Thus, the lattice is shifted to bring information domains in another layer into various work areas where normal memory functions can be accomplished. This second embodiment also has advantages in that the average access time for read-out of domains is lowered and no in-plane magnetic field capability is required. In addition, use is made of a large portion of the magnetic medium for dense storage, rather than requiring the use of great amounts of area for memory functions other than pure storage. Also, non-destructive readout can be easily accomplished and the lattice configuration is maintained at all times, thereby eliminating the need for additional circuitry required to remove and re-enter bubble domains into the lattice.

In the description of the preferred embodiments, magnetic bubble domains will be used as illustrative examples for interactive elements. However, it should be noted that any type of elements which interact with one another can be utilized, as is more completely described in aforementioned Ser. No. 395,336. Thus, any elements having stray fields associated therewith which interact with the stray fields of other elements, can conveniently be utilized.

These and other objects, features, and advantages of the present invention will be more particularly described in the forthcoming description of the preferred embodiments.

BRIEF DESCRIPTION OF THE DRAWINGS

FIG. 1A is an illustration of a lattice of interactive elements which are closely packed for high density storage, while

FIG. 2A is an illustration of a closely packed lattice while

DETAILED DESCRIPTION OF THE PREFERRED EMBODIMENTS

General Theory

Since the general concept of lattice storage systems has been adequately described in the aforementioned copending applications, only a minimum amount of detail relative to those systems will be provided herein. Generally, it should be noted that a lattice of interactive elements can be established where the elements themselves are spaced from one another and wherein the elements have positions and spacings determined by interactions occurring between the elements. Thus, the elements can be brought close to one another to provide high density storage with a maximum amount of interactive forces. These elements can be removed from the lattice or placed in the lattice by the application of forces due to external structure.

For instance, lattice systems of magnetic bubble domains are described in the copending applications where confinement means is used to confine a lattice array of bubble domains in a certain region of the magnetic material in which the domains exist. Within the lattice array, there is no structure of the type ordinarily associated with bubble domain memories. For example, no magnetic structure, such as T and I bars, is required to determine the positions of the bubble domains within the lattice and to move the bubble domains within the lattice. In the presence of the confinement forces produced by the confinement means, bubble domains can be moved into and out of the lattice in order to write in new information and to remove bubble domains for reading of the information which they represent.

In the present invention, movable lattices are provided for information handling systems where it is not necessary to have to access information from a tightly packed lattice. That is, the magnetic bubble lattice is maintained but the interactive spacing between the elements in the lattice is varied to allow performance of various memory functions, such as read and write. Accordingly, a large amount of area of the magnetic chip is used for storage of information and the lattice is relaxed in order to access information from it. This means that the lattice spacing is adjustable in the present invention in the manner of a spring which can be adjustably tensioned in order to provide proper operating conditions.

In a second embodiment, the lattice is shifted without necessarily changing the lattice spacing and an area of the magnetic chip is provided for various working functions, such as read and write. Information is contained not in the lattice domains but rather in information domains in a second magnetic layer. The domains in the information layer are magnetically coupled to the lattice domains and therefore are moved into and out of the work areas where functions such as read and write occur. This enables block access of information and allows more efficient use of the magnetic chip for storage of information. Further, the non-storage functions (read, write, annihilate, etc.) which are generally more expensive to provide and require more complex circuitry, are fabricated entirely separately from the lattice itself.

VARIABLE SPACING LATTICE

FIGS. 1A, 1B, 2A and 2B

Figure 1A:
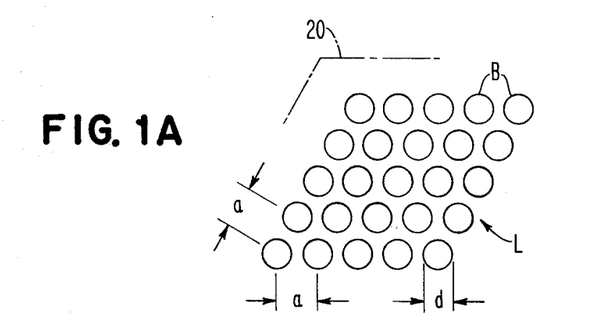

In these figures, a magnetic medium 20 has a lattice array of bubble domains B therein. The magnetic medium is any magnetic medium capable of supporting magnetic bubble domains, and includes, for example, materials having garnet structure as well as amorphous magnetic materials. In FIG. 1A, a closely packed lattice is shown where the center-to-center spacing of elements in the lattice is given by the distance $a$, which is approximately $1.3d$, where $d$ is the diameter of the bubble domains. A tightly packed lattice of bubble domains such as shown here, provides high density, high capacity storage.

Figure 1B:
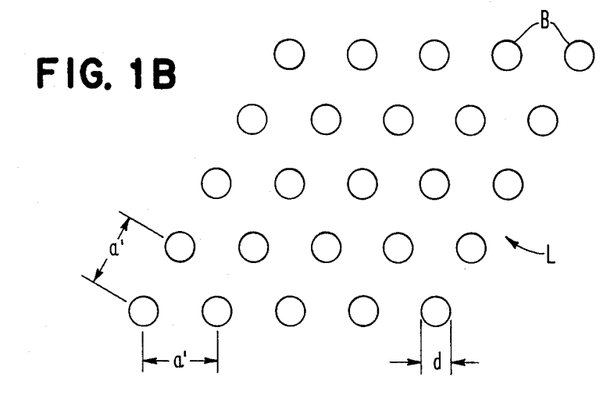
FIG. 1B is an illustration of the same lattice which is not relaxed so that the spacing between the interactive elements is greater.

In FIG. 1B, the same lattice elements are shown except that the distance between the elements has been expanded. In this case, the center-to-center spacing $a'$ of the domains is approximately $3d$. The relative positions of the domains with respect to one another is the same and the only difference between the two lattices is that the lattice of FIG. 1B is a relaxed (expanded) version of the lattice of 1A. Also, the diameters of the domains in FIG. 1B may be slightly larger than the diameters of the domains in FIG. 1A, but this difference, if any, would be very small. Also, an adjustment of the stabilizing bias field $H_Z$ (FIG. 3) can be made to maintain the domain diameter.

The domain array of FIG. 1A is used for high density storage, while the domain array of FIG. 1B is used for all other functions necessary in a bubble domain memory system. Such functions include writing, reading, and annihilation. As will be apparent, these functions are more readily achieved with the lattice of FIG. 1B, because the spacings between the interactive elements are greater. In fact, the spacings between the elements in FIG. 1B are almost great enough that the elements are isolated from one another. Thus, circuitry conventionally used for magnetic bubble domain systems, where the spacing of domains is $3-44d$, can be harmoniously used with a lattice having the spacing of that shown in FIG. 1B.

Figure 2A:
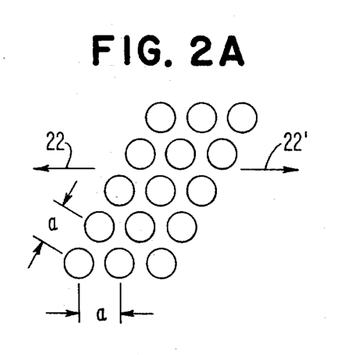
Figure 2B:
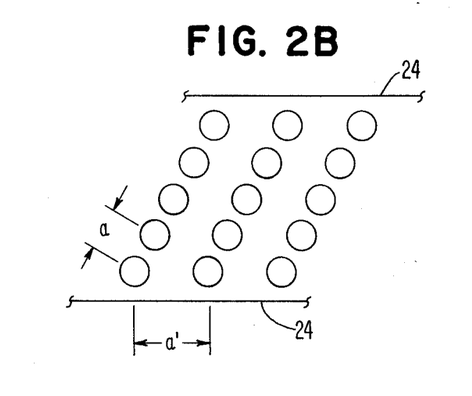
FIG. 2B is an illustration of the same lattice where the spacings between the interactive elements is greater, the lattice of FIG. 2B being relaxed along a single dimension.

FIGS. 2A and 2B illustrate a tightly packed lattice and an expanded lattice, respectively. The lattice in FIG. 2A is a tightly packed lattice which will be allowed to expand in the direction of arrows 22 and 22'. This is an expansion along a single dimension as opposed to the expansion of FIG. 1B which is in two dimensions. Thus, the lattice of FIG. 2B is obtained where the spacings between elements in different columns is larger than the quantity $a$. For instance, a spacing $a'$ of about $3d$ is suitable.

In order to contain expansion of the lattice along only a single dimension, a barrier is provided to prevent expansion along the transverse direction in FIG. 2B. This barrier is conveniently comprised of conductors 24 which carry currents establishing magnetic fields tending to keep the bubble domains from moving outwardly along a direction transverse to the direction indicated by arrows 22 and 22'. If desired, the barrier can be provided by an etched groove in the magnetic bubble domain material, by a magnetic overlay, or by any other structure that provides a magnetic restraining force. These and other types of barriers are described in great detail in the aforementioned copending application Ser. No. 395,336. Expansion/Contraction Structures (FIGS. 3, 4A, 4B)

These drawings illustrate suitable structures for providing contraction and expansion of a bubble domain lattice. Essentially, they operate on the principle that magnetic bubble domains in a lattice can be brought closely together or spaced farther from one another by magnetic forces of variable amplitude. Thus, the lattice is treated as a spring which can be expanded or contracted in one or multiple dimensions.

Figure 3:
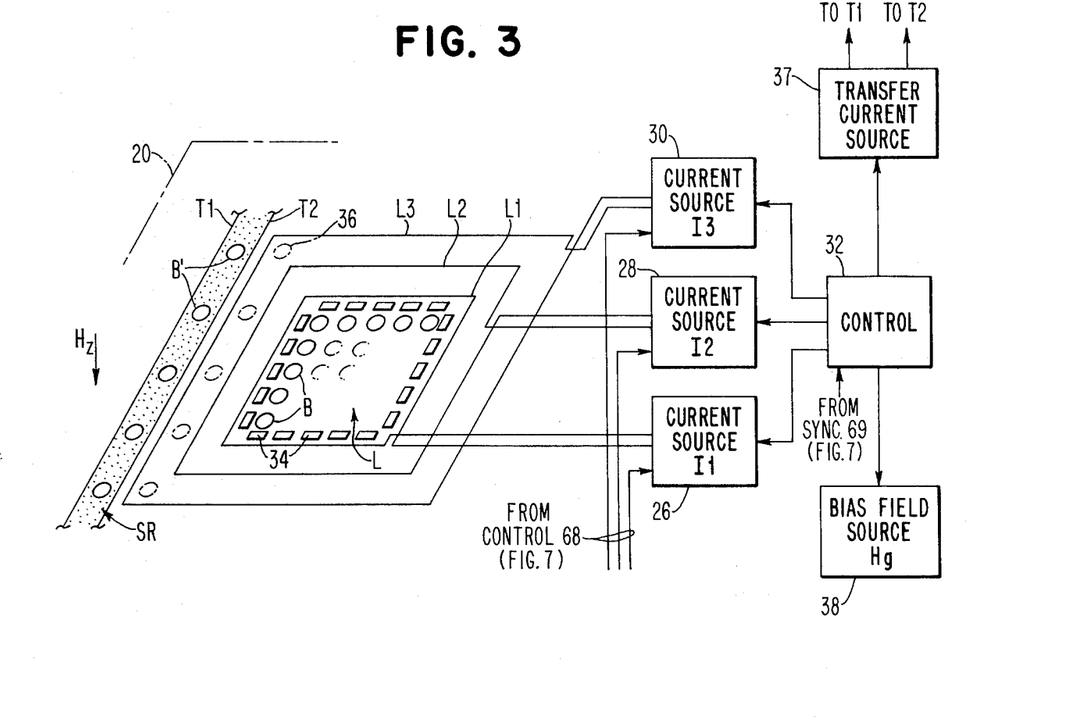
FIG. 3 is a schematic diagram of a structure suitable for providing closely packed lattices and sparsely packed lattices, i.e., a structure for contracting and expanding the lattice.
Figure 4A:
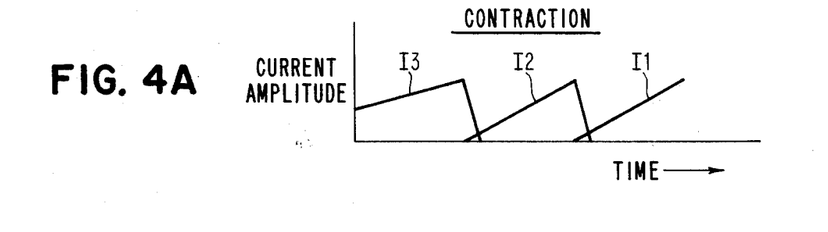
FIGS. 4A and 4B show parts of the current waveforms used in the structure of FIG. 3, for contraction and relaxation of the lattice, respectively.
Figure 4B:
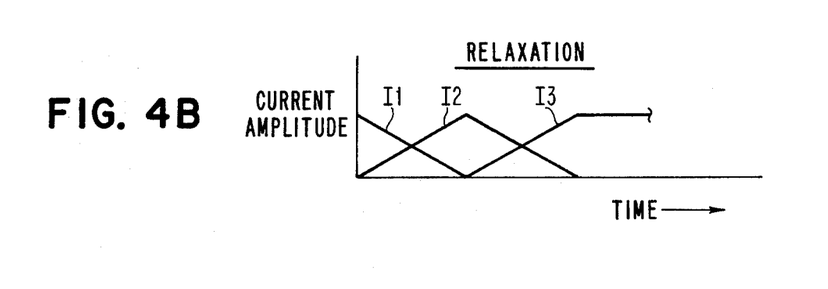

In FIG. 3, a lattice L of bubble domains B is tightly packed within confinement means L1. This confinement means is conveniently a current carrying conductor through which electrical currents can flow to establish confining magnetic fields which hold the domains B within the boundary of conductor L1. Such a confinement means has been described in aforementioned copending application Ser. No. 395,336. Also shown in FIG. 3 are larger conductor loops L2 and L3 which are located outside conductor L1. Current through these loops is used to create confining magnetic forces for holding magnetic bubble domains within the boundaries of these loops. Thus, bubble domains B can be constrained within the boundary of loop L2 and within the boundary of loop L3.

Loop L1 is connected to current source 26, which provides current I1, while loop L2 is connected to current source 28, which provides current I2. Other confinement means L3 is connected to current source 30 which provides current I3. These current sources are in turn controlled by a control unit 32.

Located within confinement means L1 are a plurality of magnetic elements 34, which can typically be comprised of a magnetically soft material such as NiFe. These magnetic elements 34 hold magnetic bubble domains which themselves provide confining forces on bubble domains in interior positions to the outer edge of bubble domains in lattice L. Thus, a passive type of confinement is provided which lessens the current requirements in conductor loop L1.

In operation, the lattice L can be contracted to fit within conductor loop L1 and can be expanded to occupy all of the space within conductor L3. Thus, the dashed circles 36 illustrate bubble domain positions when the lattice L is relaxed to occupy the area within loop L3, rather than being tightly packed within loop L1. As is apparent, the bubble-bubble spacing is then highly relaxed to allow easier manipulation of the domains in the lattice for provision of the various storage system functions.

FIG. 3 also shows a shift register SR which is indicated by the stippled portion of the drawing. This register is used to move other domains B' to positions where they can be entered into the lattice when necessary. Correspondingly, domains B which occupy positions 36 can be removed from the lattice to the area of the shift register and then taken away from the lattice, if it is desired to enter new information into the lattice. As is shown in aforementioned application Ser. No. 395,336, new information can be entered into the lattice when other information is removed from it, by another shift register on the opposite side of the lattice. Thus, the number of domains in the lattice will be maintained.

Figure 6:
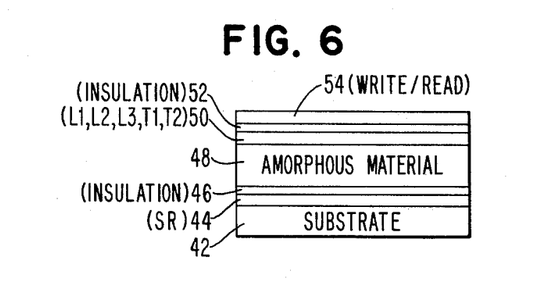
FIG. 6 is a side view of a magnetic bubble domain system using a flexible lattice, illustrating the position of various layers used to perform certain functions in the system.

The register SR can be located in another layer than that used for the conductors L1–L3, as will be more clear from FIG. 6. Such a technique is also shown in copending application Ser. No. 395,336. The current carrying conductors T1 and T2 are transfer conductors which are used to move bubble domains B' into lattice positions 36, or are used to remove domains B from lattice positions 36 into the shift register. Currents in the transfer conductors create magnetic fields which shift magnetic bubble domains to the right or to the left and overcome the confinement forces produced by current in loop L3. These access operations are easily provided by current carrying conductors and are illustratively described in copending application Ser. No. 395,336. As mentioned, the domains B' can be entered into the expanded lattice on the left-hand side of the diagram while another shift register can be provided on the right-hand side of the lattice for receiving domains removed from the expanded lattice. In this case, other transfer conductors would be provided on the right-hand side of the lattice so that domains can be removed from the expanded lattice and put into the expanded lattice at the same time.

Currents in conductors T1 and T2 are provided by transfer current source 37, which is also controlled by unit 32. A bias field source 38 provides a bias field $H_z$ for stabilizing domain size. Various bias field magnitudes across the entire magnetic medium 20 are shown in aforementioned Ser. No. 395,336.

Since the domains in the expanded lattice are spaced quite far from one another, their interactions are minimal. Additionally, their spacings are approximately the spacings which are used in conventional bubble domain propagation structures. Therefore, the bias field requirements and circuit design of the shift registers is less complex, and a greater reliance can be placed on conventional propagation structures. Further, the confinement forces used to hold bubble domains in a highly expanded lattice are less than those required to hold bubble domains in a tightly packed lattice. Therefore, the magnitude of the current I3 need not be as great as that of I2, which in turn need not be as great as I1. Again, this is an aid in circuit design since it provides less stringent requirements on the currents in the transfer conductors T1 and T2. Also, adverse magnetic field interactions between the fields produced by the propagation structures, the transfer conductors, and the confinement conductors is minimized.

FIGS. 4A and 4B show the types of waveform that can be used to provide contraction of the lattice and expansion of the lattice, respectively, As was mentioned, the magnitudes of the currents I1, I2, and I3 can be varied from one another, although they are shown as having the same maximum currents in FIGS. 4A and 4B for reasons of simplicity.

In more detail, it is initially assumed that a relaxed bubble domain lattice is contained in the area within conductor L3 by magnetic fields produced by current I3. This current increases so that greater confinement forces are provided by conductor L3. This means that the domains start moving closer to one another and farther away from L3, so that they will be under the influence of magnetic fields produced by currents in conductor L2. Thus, current I2 begins to increase, so that the magnetic forces produced by I2 become the confining barrier forces for the domains B. As time continues, the domains are brought more closely together until the entire confinement forces are provided by current I1, together with a contribution from the magnetic elements 34.

FIG. 4B illustrates the situation where a lattice L is initially tightly within the boundary of conductor L1. In order to relax the lattice, current I1 is reduced so that the domains are less confined and begin to move farther away from each other. At the same time, current I2 begins to increase in order to provide the necessary confinement forces for preventing the domains from going beyond the boundary of L2. After a period of time, current I3 begins to flow in conductor L3, so that conductor L3 will provide the necessary confinement force when current I2 begins to decrease, thereby allowing the domains to move farther from one another to occupy the full area within conductor L3.

Figure 11A:
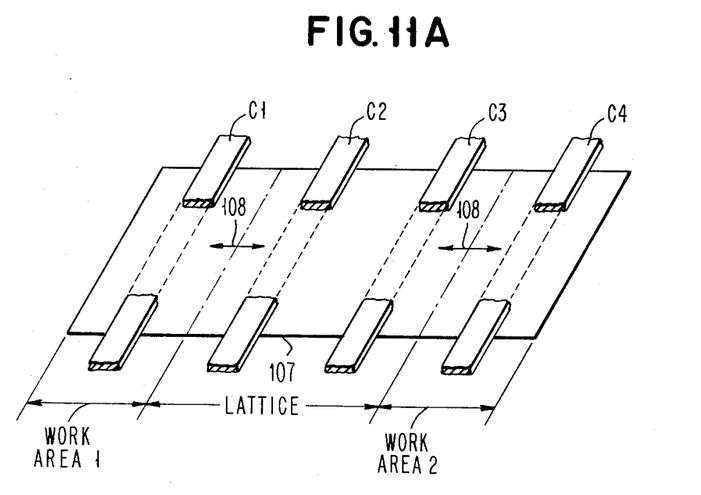
FIGS. 11A and 11B are schematic illustrations of the chip organization in the structure of FIG. 10, illustrating the storage lattice and the work areas in which various functions, such as read and write, are performed. Different techniques for shifting the lattice are shown in these figures.
Figure 11B:
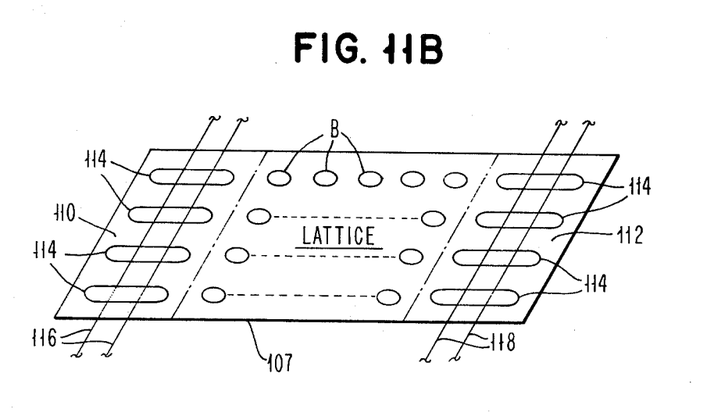

As an alternative to the approach described with respect to FIG. 3, magnetic stripe domains can be provided around the boundaries of the lattice in the manner shown in FIG. 11B. These stripe domains can be generated and annihilated to provide expandable and contractable buffer zones for expansion and contraction of a lattice. This type of approach was shown in a one-dimensional basis in aforementioned copending application Ser. No. 429,601, where the column accessing technique was described. Thus, stripe domains which act as springs can be made larger or smaller to provide contraction and expansion, respectively, or a number of stripe domains in a buffer zone can be increased or decreased to provide contraction and relaxation of the lattice.

Figure 5:
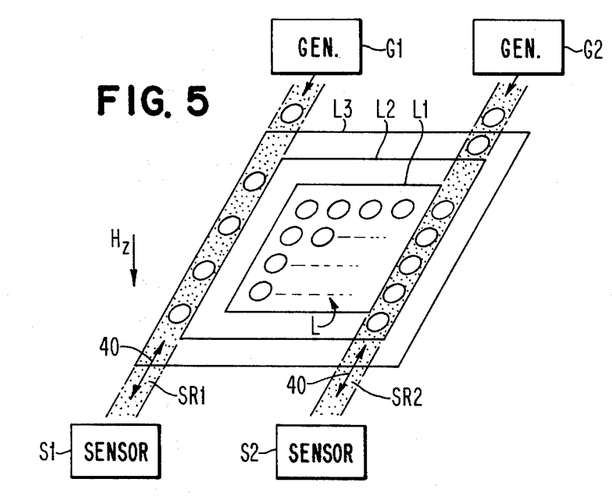
FIG. 5 is a schematic illustration of structure which can be used to provide new interactive elements in the lattice or to remove interactive elements from the lattice.

Accessing (FIG. 5)

FIG. 5 shows most of the structure of FIG. 3, with some of that structure omitted for ease of explanation. This figure indicates the various types of accessing that can be utilized for changing information in the system, if desired.

In FIG. 5, the lattice L is shown within conductor L1 and two shift registers SR1 and SR2 are provided as indicated by the stippled regions. These registers have generators G1 and G2 associated therewith, as well as sensors S1 and S2. Registers SR1 and SR2 are used to move magnetic bubble domains in the directions indicated by arrows 40. Thus, domains in the registers can be moved in two directions in these registers, although movement from the generator to the sensor of the associated register is generally utilized.

Register SR1 is located between conductors L3 and L2 while register SR2 is located between conductors L1 and L2. Thus, these registers are spatially within the lattice areas as opposed to the register SR of FIG. 3. The registers themselves can be located on other levels than the level used for the conductors L3, L2, and L1. The register can be the type of column accessing registers described more fully in copending applications Ser. No. 429,602, filed Jan. 2, 1974, now U.S. Pat. No. 3,913,079, and aforementioned Ser. No. 429,601. In this type of register, a pumping action is used to move domains from positions within the lattice. Generally, a generator is located on one end of the register in order to provide new information for entry into the lattice while a sensor is located on the other end of the register for sensing information taken out of the lattice. The registers are magnetically closed at one end so that, when localized magnetic fields are applied to some of the domains in the register, these domains will expand and exert forces on the domains at the magnetically closed end. When the magnetic closure is released, the domains previously held will be moved along due to the force of the domains which have been expanded by the aforementioned local field. Thus, unidirectional motion can be achieved.

Column accessing of the type described in the aforementioned copending application can be utilized in FIG. 5 to access domains, if such is desired. Since the accessing can occur in a lattice which is not tightly packed, the constraints on that type of accessing are somewhat alleviated. Additionally, because the domains in the expanded lattice have larger interdomain spacings, a register of the type more conventionally known (such as a conductor loop register) can also be utilized.

FIG. 6

FIG. 6 is a side view of a composite structure showing the various layers used to provide the functions associated with a complete system. In this diagram, a substrate 42 has an electrical layer 44 therein, which can be used to provide the shift register functions. Substrate 42 can be any convenient material, such as glass or other materials. Located on layer 44 is an insulation layer 46, such as $SiO_2$. The bubble domain material, such as amorphous layer 48, is then provided in which the lattice of bubble domains will exist. Located over amorphous magnetic material 48 is another layer of electrical conductors 50 which is used to define the confinement means L1, L2, L3, and the transfer conductors T1 and T2. Layer 50 is generally coated with an insulation layer 52 over which is deposited a layer 54 comprised of magnetic elements such as are required for the read and write operations. Also, the conductors used for these elements can also be in this layer.

Figure 10:
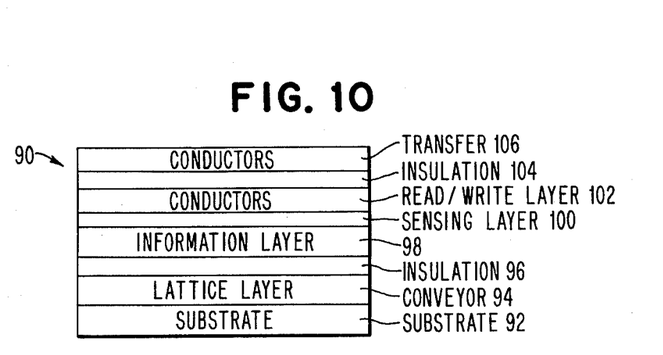
FIG. 10 is a side view of a composite array of films used to provide a system having a movable bubble domain lattice, where information domains are present in a second magnetic layer.

The exact arrangement of the individual layers relative to one another is not critical. Also, if a single crystal garnet substrate is used, the bubble domain layer can be a garnet material and garnets can also be used for the insulation layers. In this case, the confinement and transfer conductors can be located in one electrical level which is insulated from another electrical level having the conductors used for the read and write circuits. Still another level can be comprised of magnetic elements used for the generators and sensors. This magnetic layer is conveniently located between one of the conductor layers and the bubble domain medium, or is located over an insulating layer deposited on the bubble domain medium. FIG. 10 is exemplary of this type of fabrication layout.

Figure 7:
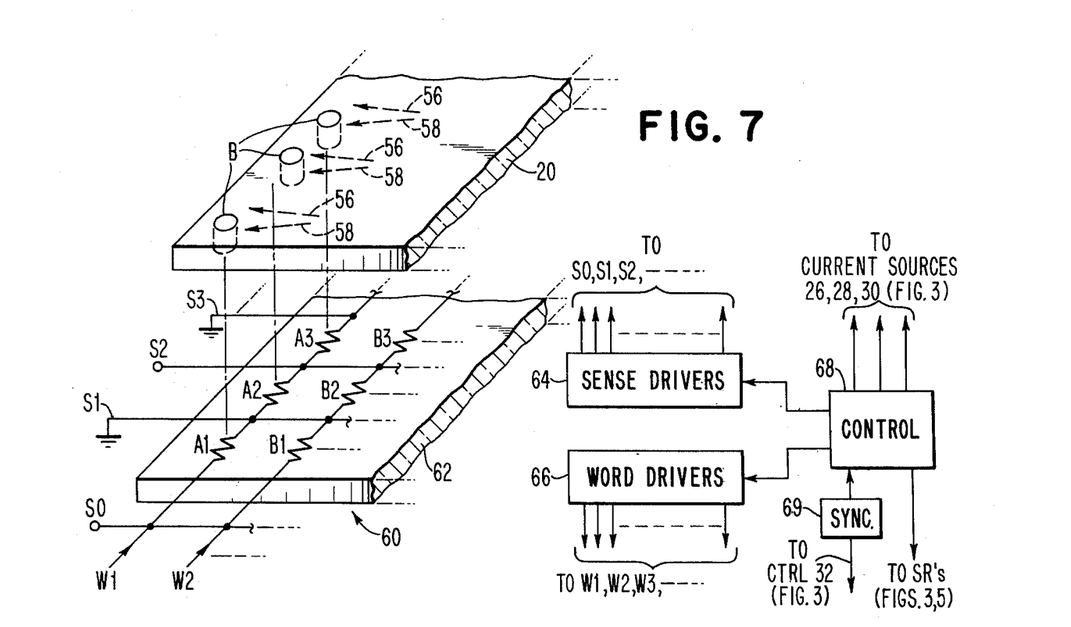
FIG. 7 is a schematic illustration indicating the relative locations of the bubble domain lattice layer and a sense chip having a sensor array thereon for detection of bubble domains in a relaxed lattice.
Figure 8:
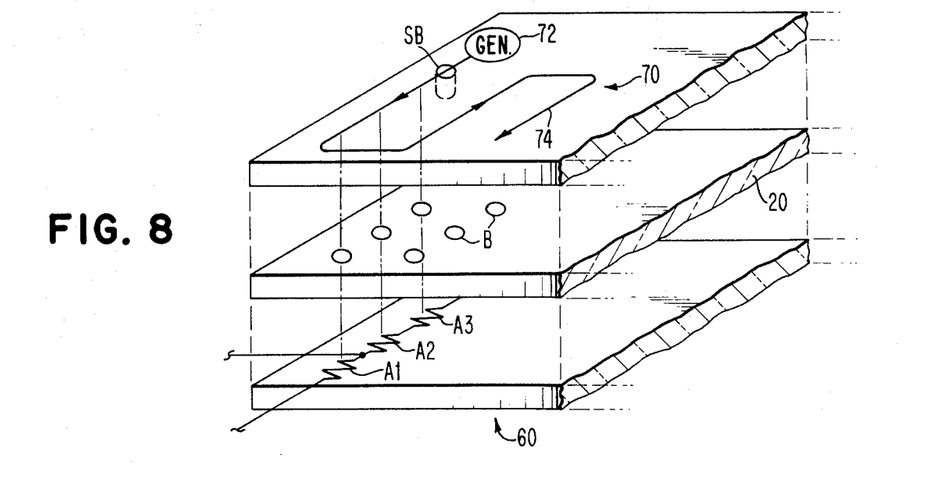
FIG. 8 schematically illustrates another technique for sensing bubble domains in an expanded lattice, where a scanning bubble domain in an overlying scan chip is utilized.
Figure 9:
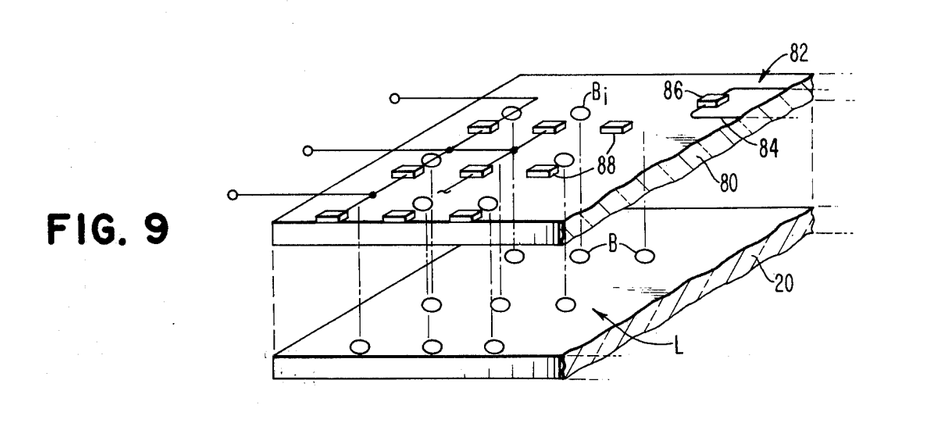
FIG. 9 is a schematic illustration of the use of an expandable lattice, together with a separate magnetic layer which contains information bubble domains magnetostatically coupled to bubble domains in the flexible lattice.

Bubble Domain Sensing (FIGS. 7-9)

These figures illustrate three different types of sense circuits which can be used to detect bubble domains in an expanded lattice array. These sensing techniques can be used to detect different wall magnetization properties of the domains within the lattice to thereby read the information contained in the lattice. In more detail, FIG. 7 shows a system in which magnetic bubble domains are coded in terms of their wall magnetization rotation, in a manner more fully described in aforementioned copending application Ser. No. 375,289, filed June 29, 1973, now U.S. Pat. No.3,890,605. In that type of coding, bubble domains are deflected at different angles in a gradient magnetic field normal to the bubble domain medium depending upon the number of rotations of their wall magnetization as one proceeds around the periphery of the domain wall. Thus, domains are detected by observing their angle of deflection in the gradient magnetic field.

As an example, three domains B are shown in the magnetic medium 20. These domains are part of the expanded lattice L of domains which has been stored in that magnetic medium. As the lattice is expanded, magnetic field gradients are produced by the conductors L1-L3. Thus, the domains will follow paths which depend on their behavior in the gradient magnetic field in accordance with the principles just described. If these domains are binary coded, each domain will follow one of two paths in the gradient fields. One path is indicated by arrow 56 while a second path is indicated by arrow 58. Consequently, domains can be detected by providing a magnetic sense chip, generally designated 60, which contains a plurality of sensors spatially located so that only domains following certain paths of deflection will be detected. In the example shown in FIG. 7, domains which deflect along path 58 will be detected by the sensors located in chip 60. Domains which follow path 56 will not be sufficiently close to couple their magnetic flux to the underlying sensors and will therefore not produce voltage output signals. Consequently, the sense chip will provide an indication of the state of all domains in each column of domains in the expanded lattice in accordance with the response of the individual sensors in the sensing array.

Figure 13:
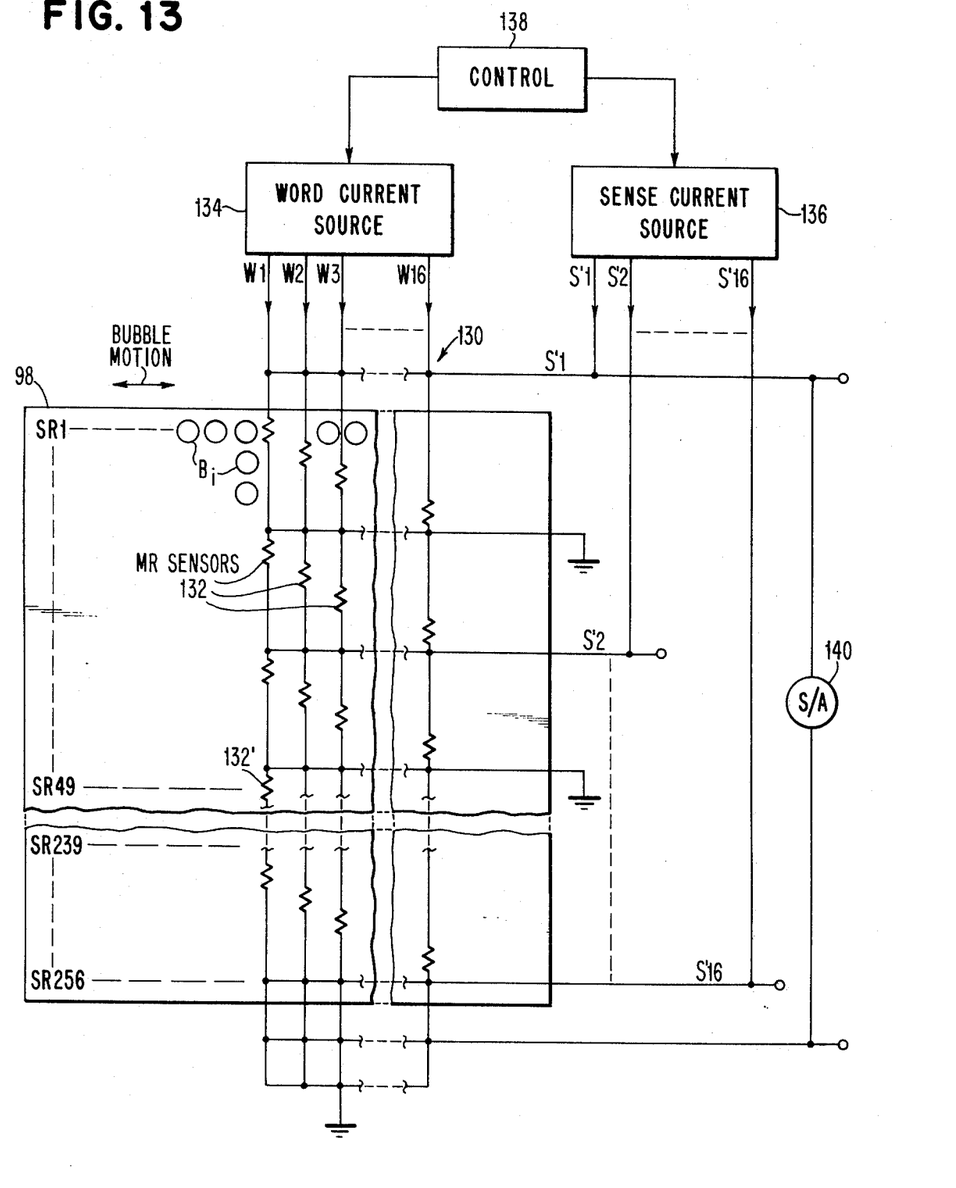
FIG. 13 is an illustration of structure used to provide a sensing array for reading of magnetic bubble domains in an information layer magnetically coupled to bubble domains in a movable lattice.

In more detail, sense chip 60 is provided by a suitable substrate 62 (such as glass) which has a plurality of magnetoresistive sensors A1, A2, A3, . . . , B1, B2, B3, . . . , etc. Connecting the various sensors are conductor word lines W1, W2, . . . and sense lines S0, S1, S2, S3, . . . . By pulsing appropriate word conductors W and sense conductors S, selected ones of the sensor elements can be read to determine their state. This will be more apparent when a more full description of FIG. 13 is given later in the specification.

Associated with the circuitry of FIG. 7 are the sense drivers 64 which provide current inputs to lines S0, S1, S2, . . . and the word drivers 66 which provide word current to the word lines W1, W2, . . . . Sense driver 64 and word driver 66 are under control of a control circuit 68 which selectively sends current pulses along the proper conductors. Control 68 also provides timing and synchronization signals to the current sources 26, 28 and 30 shown in FIG. 3 and to the shift registers shown in FIGS. 3 and 6. Synchronization circuit 69 provides signals to control units 68 and 32 (FIG. 3) to properly synchronize their operation. If desired, a single control circuit can be used to provide the proper timing signals to all of the current sources required for functions such as transfer, bubble domain propagation, confinement, generation, sensing, and annihilation.

Since the domains in an expanded lattice are well separated from one another, the sensing array is easily provided using conventional fabrication techniques. Further, since the exact positions of the bubble domains with respect to one another are not critical in the expanded lattice, the amount of separation due to the various deflection paths 56 and 58 can be maximized. When it is desired to contract the lattice, the uniform magnetic fields applied easily contract the relaxed lattice so that the domains are in positions which will allow them to be brought into tight packing relationship in the final stage of lattice contraction. That is, the difficulty of contraction is minimal when the lattice is expanded and therefore variations in domain positions due to the sensing or generation operations have a minimal effect on overall stability.

FIG. 8 shows a sensing technique in which the magnetic field gradients used to deflect the lattice bubble domains are provided by a scan chip 70, that utilizes a scanning bubble domain SB. The scanning bubble domain is produced by a generator 72, and follows a path indicated by the meandering arrow 74. This path is provided by conventional shift register elements so that the scanning bubble domain passes each of the bubble domains B in the expanded lattice of magnetic medium 20. Thus, the scanning domain provides a magnetic field which tends to deflect the domains B which are in turn sensed by the sense chip elements A1, A2, etc.

While the path of the arrow 74 is shown as being along one direction for one row of lattice domains and in the opposing direction for the next adjacent row of lattice domains, it should be understood that each row of lattice domains can be scanned in the same direction by the domain SB. The domains in the expanded lattice are sufficiently far apart that the scanning bubble domain can loop back to the same side of the scan chip 70, in order to scan each row of lattice domains in a same direction. Alternatively, any number of scanning bubble domains can be provided so that each row can be scanned at the same time, if desired.

As with the apparatus of FIG. 7, conventional control circuitry is provided to activate the sense chip 60 and to synchronize the operation of the scan chip 70 with the readout provided by sense chip 60.

FIG. 9 shows a double magnetic layer structure in which the lattice domains are located in the magnetic layer 20, while information carrying domains are located in an adjacent magnetic layer 80. The information domains are generally designated $B_i$. They are produced by a domain generator 82, which in this case is a current conducting loop 84 and a magnetic element 86. This nucleator will provide bubble domains in magnetic medium 80 when current is present in conductor 84. The current produces a magnetic field at the end of magnetic element 86 which in turn nucleates a domain in magnetic material 80, as is well known in the art. Any number of these domain nucleators can be provided to produce the information domains $B_i$.

The information domains $B_i$ are magnetostatically coupled to the lattice domains B in layer 20. Therefore, the spacing of the information domains will correspond to the spacing of the lattice domains L. Rather than having the lattice domains be coded, coding in the apparatus of FIG. 9 is provided by the conventional presence/absence of information domains $B_i$. Since these domains are coupled to the domains B, they will have the spacing of the lattice domains when the lattice is expanded. To provide sensing of the information domains, a plurality of magnetoresistive sensors is located so that they are over each domain position corresponding to a position of the domains in the lattice L. Each of the magnetoresistive sensors 88 is connected similarly to the manner of arrangement of sensors A1, . . . , B1, . . . shown in sense chip 60 of FIG. 7. Therefore, not all of the electrical connections are shown in FIG. 9, for ease of drawing.

To sense information using the apparatus of FIG. 9, the lattice L is expanded. This causes the information domains to expand their spacings and will bring them to positions adjacent to the magnetoresistive sensors 88.

However, since coding is in terms of the presence and absence of domains $B_i$, only those sensors 88 which have domains $B_i$ in flux coupling proximity thereto will provide voltage outputs when the sensing array is scanned by coincident currents. Therefore, binary coding is provided without having to rely on different magnetic properties of domains in the lattice.

Thus, various techniques have been shown for writing and sensing domains in a lattice whose inter-element spacing can be varied for provision of certain functions. In addition to the coding shown, domains can be coded in terms of pure chiral states. That is, the wall magnetization in the domains can be in a uniform direction around the periphery of the domain wall as is described in aforementioned copending application Ser. No. 395,336. For this type of coding, in-plane magnetic fields are used to provide different deflections of the domains to distinguish chiral states, and such fields can easily be provided using conductors or magnetic elements in the manner described in that copending application.

Figure 12:
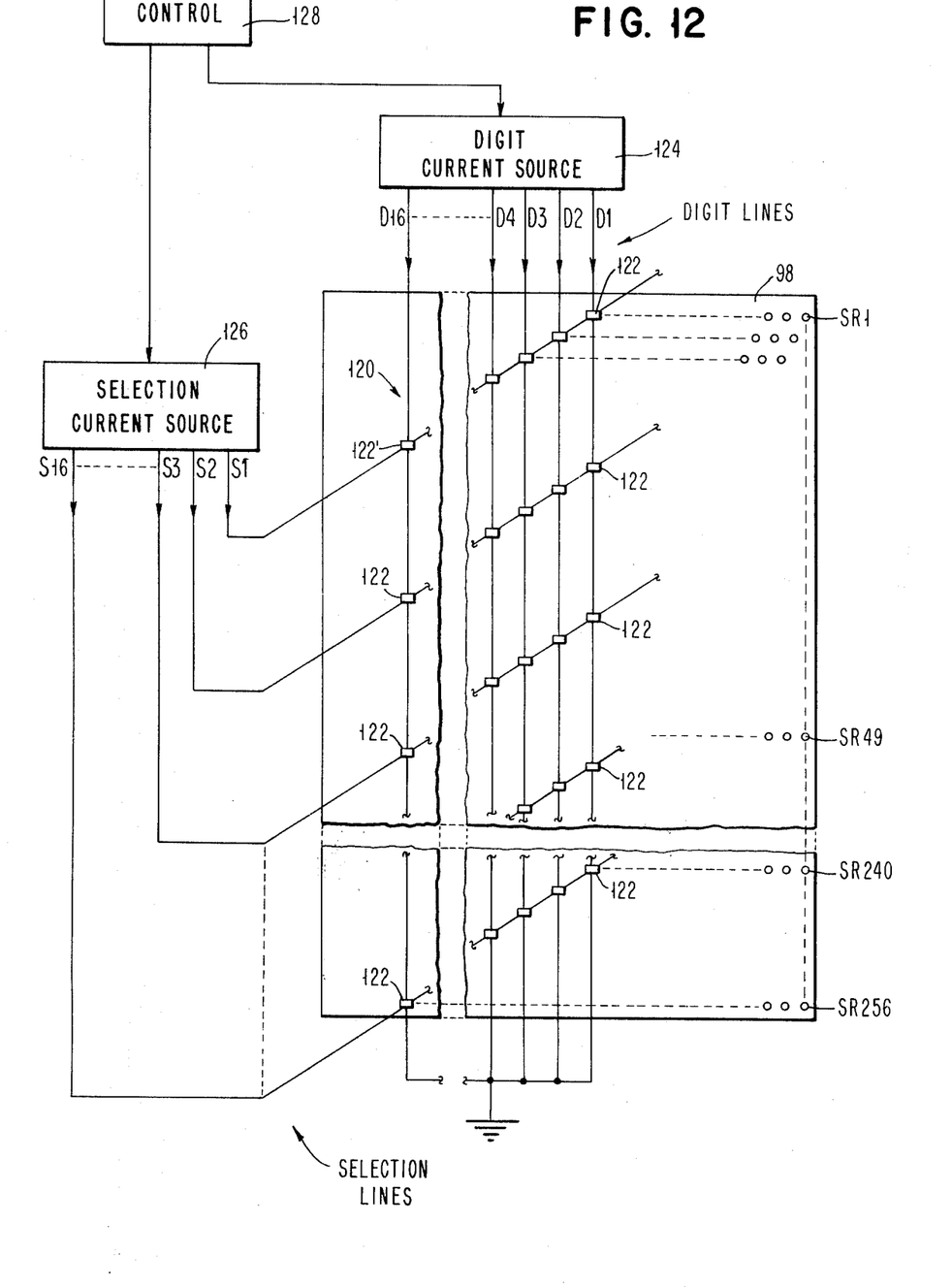
FIG. 12 illustrates the electrical connections and structure used to provide a write chip for either generating or annihilating magnetic bubble domains in an information layer of bubble domains.

While annihilation has not been shown in detail, domains taken from the lattice can be annihilated in conventional ways after sensing. Additionally, arrays of magnetic elements or conductors can be utilized to provide localized magnetic fields for collapse of individual domains in the expanded lattice or for collapse of the entire lattice. Such arrays can be similar to the nucleator 82 shown in FIG. 9, where such nucleators are provided in a plurality of locations for producing magnetic fields of the proper magnitude and direction to collapse bubble domains B in an associated lattice layer. Arrays of this type are shown in FIG. 12, and will be more carefully described in the discussion of that FIG.

MOVABLE FIXED LATTICE (FIGS. 10–14)

In this embodiment, the inter-domain spacings in the lattice are preferably maintained while the lattice is shifted back and forth to bring information domains coupled to the lattice domains into and out of work areas where various memory functions are defined. The memory functions such as read, write and annihilation, are performed on domains in the information layer, the lattice being used for conveyor purposes, in the manner previously described with respect to copending application Ser. No. 429,601. Thus, the lattice domains do not have to be coded for representation of information, and do not have to be removed from the lattice for the read operation.

FIG. 10 shows a side view of a composite film structure 90 which indicates the various layers that comprise the overall information handling apparatus. On the substrate layer 92 is a lattice layer 94 which is a magnetic medium in which the lattice bubble domains exist. This is designated as a conveyor, since the function of the lattice domains is to convey domains which are in the information layer and which represent the actual information in the information handling apparatus. An insulation layer 96 is deposited on lattice layer 94 and serves as a substrate for the second magnetic bubble domain layer 98. Layer 98 contains the information bubble domains and is the information layer in this structure.

In a situation where garnet structure bubble domain materials are desired, the substrate 92 can be a non-magnetic rare earth garnet, such as GGG, while the conveyor 94 is a magnetic rare earth iron garnet material which is substantially lattice matched to the substrate 92. In the case of garnet bubble domain materials, insulation layer 96 is conveniently another non-magnetic garnet material, such as GGG, which is lattice matched to layer 94. This allows formation of another rare earth iron garnet material for the information layer 98. Again, the layer 96 is a single crystal so that a single crystal garnet material can be grown as the information layer 98. Techniques for providing these layers by processes such as liquid phase epitaxy are well known in the art. Additionally, the compositions of suitable garnet materials for both the substrates and the bubble domain layers 94 and 98 are also well known. References which describe magnetostatically coupled garnet films include Y. S. Lin Et al., Appl. Phys. Lett. Vol. 23, No. 8, Oct. 15, 1973, p.485, and Y. S. Lin et al., J. Appl. Phys. 45, No. 9, September 1974, p.4084. Amorphous magnetic films can also be used for the bubble domain layers.

Located over information layer 98 is a sensing layer 100, which is typically comprised of magnetic elements such as NiFe. This layer is used for sensing the information bubble domains in layer 98 as will be described later.

Located over layer 100 is a conductor layer 102, which is used to provide the electrical signals used for the read and write functions.

An insulation layer 104 is deposited on layer 102 in order to electrically insulate the conductors of layer 102 from the subsequently formed conductor layer 106. Insulation 104 is conveniently $SiO_2$.

The electrically conducting layer 106 includes the conductors which are used for functions such as transfer of bubble domains and movement of bubble domains in the lattice conveyor layer.

Thus, the apparatus for the movable fixed lattice comprises various functional layers which include the required electrical conductors as well as the magnetic elements typically used for read and write operations. Coding is in the form of the presence and absence of domains in information layer 98, and the spacing of these information domains is dependent on the spacing of the domains in the lattice layer 94. Therefore, high density spacing of the information domains is achieved because the lattice domains can be tightly packed. In this structure, the various memory functions are achieved in an advantageous manner relative to prior art schemes because domains do not have to be put into the lattice or removed from the lattice in order to provide such typical memory functions as read, write and annihilate. As will be more apparent, various overlay patterns are used to provide these functions and such features as block accessing are readily obtainable, in contrast with serial accessing which is presently used in the prior art techniques.

FIG. 11A illustrates the lattice conveyor function. In this drawing, part of the magnetic layer 94 is used for a lattice of bubble domains as is indicated by boundary 107. This lattice can be moved to the left or to the right in the direction of arrows 108 to bring the lattice domains B into and out of the work areas 1 and 2. Movement of the lattice domains in this manner means that information domains which are magnetostatically coupled to the lattice domains will also be shifted to either the left or the right. When the information domains are shifted to the left to be in positions corresponding to the work area 1, functions such as write, read and annihilate can be performed. Correspondingly, these functions can be performed on the information domains when they are shifted to the right to be in positions corresponding to work area 2. Thus, half of the columns of information domains can be addressed in work area 1 while the other half of the columns of the information domains are addressed in work area 2.

In FIG. 11A, movement of the lattice in the direction of arrows 108 is conveniently provided by magnetic fields established by currents in the sweeper conductors C1, C2, C3, and C4. These are wide conductors having widths at least equal to about 2 or 3 columns of lattice domains. As is explained in copending application Ser. No. 395,336, currents in these conductors provide magnetic field gradients which move columns of lattice domains in a direction determined by the magnetic field gradient. Of course, this is determined by the direction of currents in these conductors. Control circuitry is conveniently provided for the current sources connected to the conductors for properly timing the onset of current pulses in the sweeper conductors. This operation is well understood and is described in detail in copending application Ser. No. 395,336.

FIG. 11B illustrates another technique for shifting the lattice L to the left or the right. In this technique, buffer zones 110 and 112 are provided. These buffer zones contain stripe domains 114 which can be made large or small, or can be split by the overlying conductors 116 and 118. Thus, the stripe domains act as springs which can be made larger or smaller to cause the lattice to be shifted to the left or the right. For instance, if the stripe domains in buffer zone 110 are made larger while the stripe domains in buffer zone 112 are made smaller, a net force to the right will exist and the lattice domains B will be shifted to the right to work area 2. If the reverse is true, the domains will be shifted to the left to work area 1. This type of stripe domain expansion and contraction mechanism for movement of the lattice is described in aforementioned copending application Ser. No. 429,601, as well as in copending application Ser. No. 494,940, filed Aug. 5, 1974. Additional buffer zones can be provided along the other two edges of the lattice in order to provide two-dimensional shifting, if desired. This is another technique for expansion and contraction in one or two dimensions, and can be used for varying the interactive spacing between the domains.

FIG. 12

FIG. 12 shows an overlay pattern which can be used to provide nucleate (write) and annihilate (clear) functions in order to change information in the bubble domain layer 98.

In more detail, layer 98 is located below an array 120 which is comprised of magnetic elements 122 which have various conductor lines associated therewith. In this case, sixteen digit lines D1, D2, ..., D16 are provided which run vertically in the drawing, while 16 selection lines S1, S2, ..., S16 are provided which run in a transverse direction. The digit current lines are connected to a digit current source 124 while the selection lines are connected to a selection current source 126. These current sources operate under control of control unit 128. Control unit 128 enables the current sources 124 and 126 to provide coincident currents along these various digit lines and selection lines in order to establish magnetic fields which couple the magnetic elements 122. Thus, any of these magnetic elements can be coincidentally selected for provision of a magnetic field which couples to domains located in the information layer 98. Depending upon the strength and direction of these magnetic fields, new domains can be written in the information layer, or domains already existing in that layer can be annihilated. Thus, the write and annihilate functions are obtained.

In FIG. 12, 256 shift registers are illustratively present in the information layer 98. This is designated by the right-hand column labeled SR and the numbers SR1, SR2, ..., SR49, ... SR256.

The combination of the magnetic elements 122 and the overlying digit lines and selection lines provides domain nucleators and annihilators in a manner well known in the art. For instance, if a current is present in digit line 16 at the same time a current is present in selection line 1, a magnetic field of sufficient magnitude will couple to the magnetic element 122' located at the intersection of these conductors. In a manner well known in the art, a magnetic field normal to the plane of layer 98 will be produced of sufficient magnitude to either nucleate a domain in layer 98 or annihilate a domain located directly below the magnetic element 122. Thus, the write and clear functions can be performed on individual domains in layer 98.

The array 120 is provided in work areas 1 and 2 in order to be able to perform the write and clear functions on all columns of information domains. Thus, if the lattice is shifted to the left, half of the columns of information domains will be brought into work area 1 where the write and clear functions can be performed, while if the lattice is shifted to the right to bring the information domains into work area 2, a corresponding array 120 can be used to provide the write and clear functions on the domains in work area 2. As will be appreciated, block writing or annihilation can occur using the array 120. It is not necessary to remove domains from the underlying lattice in order to read or change information. This operation is done in the information layer while the lattice is maintained, and those operations can be performed either serially or in parallel.

FIG. 13

FIG. 13 illustrates a sensing array 130 which is contained in layers 100 and 102 as shown in FIG. 10. That is, the individual magnetoresistive sensor elements are typically comprised of NiFe (permalloy) which is present in layer 100, while the associated word lines and sense lines are present in layer 102.

The sense array 130 can be used to provide random selection of sensors corresponding to various shift registers in the information layer 98. Also, serial readout within each shift register is possible using the array 130.

As was described with respect to FIG. 12, information layer 98 contains domains $B_i$ which are present in a plurality of shift registers, herein designated SR1, SR2, ..., SR49, ..., SR256. Bubble domains $B_i$ can be shifted to the right or left as indicated to bring them to positions corresponding to the sensors in array 130.

Sense array 130 is comprised of a plurality of magnetoresistive (MR) sensors 132 which are electrically connected to word lines and sense lines. In the particular case shown, where 256 shift registers are provided in information layer 98, 16 word lines W1, W2, ..., W16 are used and 16 sense lines S'1, S'2, ..., S'16 are used. The word lines are connected to a word current source 134 while the sense lines are connected to a sense current source 136. Current sources 134 and 136 operate under control of control unit 138. In operation, coincident selection techniques are used to serially readout information contained in the various shift registers SR1 ... SR49 ... SR 256. For instance, if it is desired to read out SR49, a word current $I_w$ is applied on word line W1 at the same time as a sense current $I_s$ is applied on sense lines S'3 and S'4. This produces a current through MR sensor 132' which detects the presence and absence of domains $B_i$ in SR49. In the sense array 130, the output lines are connected across a sense amplifier 140 for amplification of the resultant signals.

Thus, the information domains $B_i$ are read by circuits which do not disturb the magnetic coupling between the information domain and the domains B in the underlying lattice layer. Further, domains do not have to be removed from the lattice in order to provide a read out operation. Thus, the normal accessing circuitry is not required and the attendant problem of moving domains into and out of a tightly packed lattice against the various confinement forces used is also not required.

Figure 14:
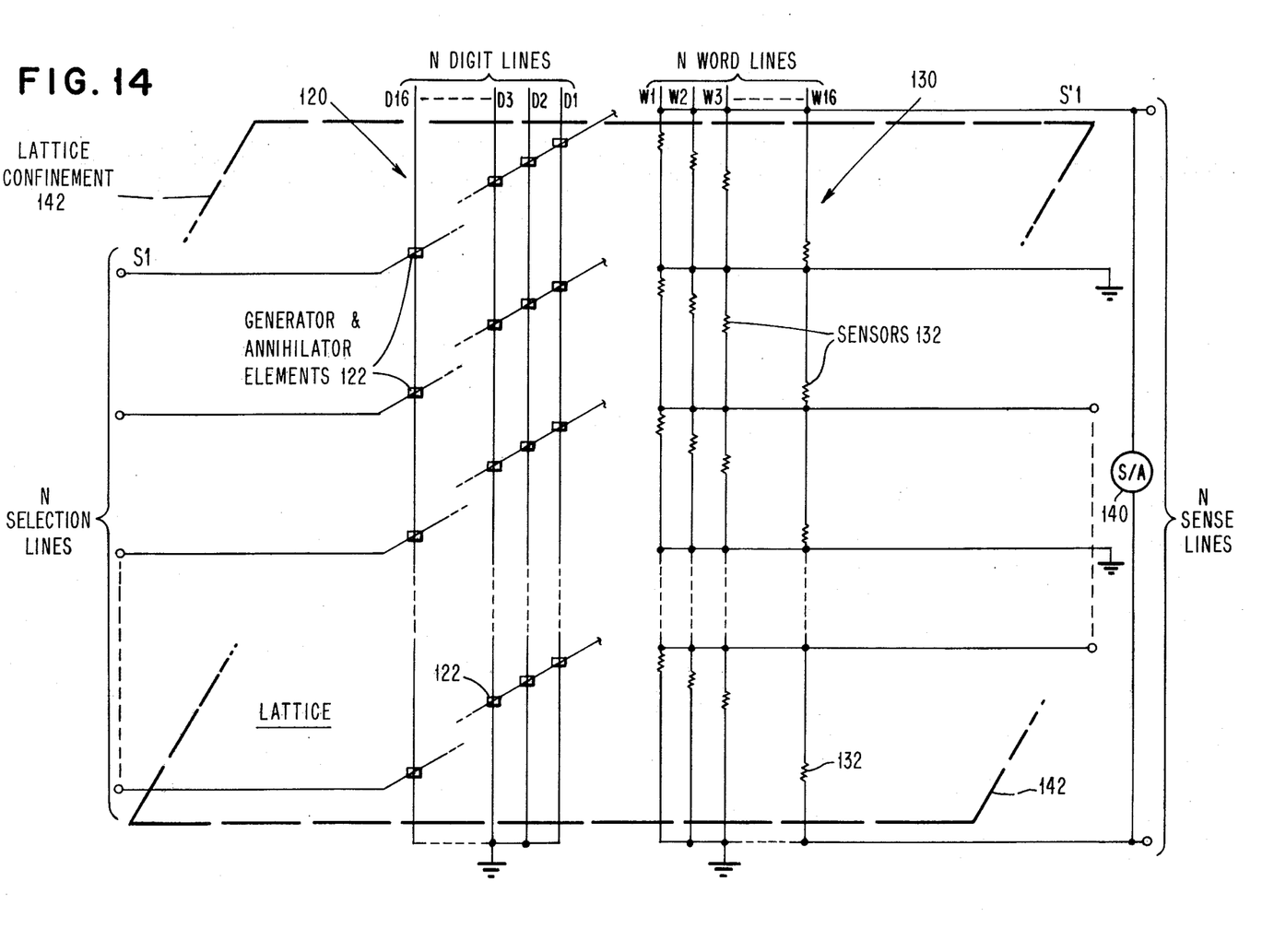
FIG. 14 is a schematic illustration of a lattice file system using a movable fixed lattice, where the drawing indicates the relative positions of the write circuitry of FIG. 12 and the read circuitry of FIG. 13.

FIG. 14

FIG. 14 is a schematic overview which illustrates the spatial locations of the various elements with respect to one another. In this view, the write/clear array 120 is located over the left-hand area of the lattice, while the sense array 130 is located over the right-hand side of the lattice. The boundaries of the lattice and its motion are determined by the lattice confinement 142 which is shown here as a heavy dashed line. This confinement is any general confinement structure, including etched grooves in layer 94, current carrying conductors, magnetically soft elements, etc. The sweeper conductors C1-C4 or the domain buffer zones shown in FIG. 11B are not shown in this drawing for ease of illustration. As was stated, they are used to shift the lattice back and forth in order to bring the magnetically coupled information domains $B_i$ into and out of the various work areas.

What has been shown is a lattice system which generally maintains the lattice and provides total memory operations without having to move domains into a lattice or remove domains from the lattice. In most operations illustrated here, such operations can be directly performed without requiring the aforementioned lattice accessing. It it is desired to access domains in the lattice, as for example when the coded information in the lattice is to be modified, techniques are shown for doing this by structure which does not have the tight margins of the structure used in the prior art.

As is apparent to those of skill in the art, the interactive elements need not be magnetic bubble domains but could be any type of elements having stray fields associated therewith which cause interactions between the elements. These interactions establish repulsive forces tending to keep the interactive elements spaced from one another in order to define the lattice. Further, any type of coding can be provided when it is desired to have the domains in the lattice coded. An adjacent information layer can be provided for use with the movable fixed lattice when it is desired to use conventional coding techniques, as for instance coding in terms of the presence and absence of the interactive elements. Thus, a lattice system is provided which seeks to utilize the inherent flexibility and stability of the lattice itself to provide improved system performance. As such, this invention distinguishes from the prior art where elements are taken from the lattice for performance of many memory functions.

What is claimed is:

1. A magnetic bubble domain lattice system, comprising:

means for producing a stationary lattice of spaced, interacting bubble domains coded to represent information in a magnetic medium, means for changing the spacing between said bubble domains in said lattice while maintaining the number of bubble domains and their relative positions in said lattice, means for sensing said bubble domains after said spacing is changed to sense said information.

2. The system of claim 1, where said means for sensing is an array of sensors.

3. The system of claim 1, where said means for changing includes means for expanding and contracting the spacing between domains in said lattice.

4. The system of claim 1, further including means for putting domains into said lattice after said spacing is changed.

5. The system of claim 1, further including a second magnetic medium having magnetic bubble domains therein which are magnetically coupled to said domains in said lattice.

6. The system of claim 1, where said means for changing includes field means for providing different magnetic fields on the domains within said lattice.

7. The system of claim 6, where said field means includes electrical conductors.

8. The system of claim 6, where said field means includes buffer zones having stripe domains therein.

9. An apparatus using interactive elements, comprising:

means for producing a lattice of N interactive elements spaced from one another and interacting with one another which occupies a given area, said elements being coded to represent information, means for changing the size of the area occupied by said lattice of N interactive elements while maintaining all of said elements in said lattice, sense means for sensing said elements in said lattice to read said information.

10. The apparatus of claim 9, where said interactive elements have stray fields associated therewith.

11. The apparatus of claim 9, further including means for producing forces on said elements within said lattice.

12. The apparatus of claim 9, where said means for changing includes means for increasing and decreasing the area occupied by said lattice.

13. The apparatus of claim 12, further including means for putting interactive elements into said lattice and means for removing interactive elements from said lattice.

14. The apparatus of claim 12, where said means for changing includes means for maintaining the shape of said lattice when its area is changed.

15. The apparatus of claim 12, where said sense means senses said elements after said lattice area is increased.

16. A method for reading information represented by coded interactive elements in a lattice of such elements, said method including the steps of expanding the equilibrium spacing between the elements in said lattice to relax said lattice while maintaining the same number of elements in said lattice, and detecting the information represented by said coded interactive elements after said lattice is relaxed.

17. The method of claim 16, where said elements are magnetic bubble domains.

18. The method of claim 16, including the further step of decreasing the equilibrium spacing between said elements after said detection step.

19. The method of claim 16, where said information is detected while said elements are in said lattice.

20. The method of claim 16, including the further step of taking elements to be detected out of said lattice prior to said detecting step.

21. An apparatus, comprising:
   means for producing a lattice of interactive elements which are spaced from one another by an element-element equilibrium spacings $a_0$, said elements interacting with one another and tending to repel one another,
   means for relaxing said lattice by increasing the element-element equilibrium spacing between said elements in said lattice to a new value $a_1 > a_0$ while retaining the same numnber of elements within said lattice,
   means for removing said elements from said relaxed lattice,
   means for entering elements into said relaxed lattice,
   means for contracting said lattice by decreasing the element-element equilibrium spacing between said elements in said lattice while retaining the same number of elements within said lattice.

22. The apparatus of claim 21, including means for detecting elements taken from said relaxed lattice.

23. The apparatus of claim 21, further including additional interactive elements which are coded to represent information, said additional elements being coupled to interactive elements in said lattice.

24. The apparatus of claim 21, where said elements are magnetic bubble domains.

25. A memory apparatus using magnetic bubble domains for representing information and exhibiting the functions of storage, writing, and reading, comprising:
   storage means for storing said bubble domains in a lattice of said bubble domains, said lattice being characterized by high density packing where the bubble domains in said lattice are interacting with one another,
   means for relaxing the packing of said lattice while retaining the same number of bubble domains in said lattice to provide a lattice having a lesser density,
   means for writing new information into said apparatus and means for reading information, when said lattice is relaxed to its lesser density.

26. The apparatus of claim 25, where said bubble domains in said lattice are coded to represent information.

27. The apparatus of claim 25, where said writing means includes an array of magnetic bubble domain generators for producing magnetic bubble domains, and said reading means includes an array of magnetic bubble domain sensors for detecting said domains.

28. A composite structure comprised of a plurality of layers, said composite including:
   a first layer of magnetic bubble domain material in which bubble domains can be moved,
   a second layer of magnetic bubble domain material,
   a third layer comprising means for producing a lattice of magnetic bubble domains in said first layer,
   a fourth layer comprising means for shifting said lattice of bubble domains in said first layer,
   a fifth layer including means for generating second magnetic bubble domains in said second layer, said second bubble domains being magnetically coupled to said first magnetic bubble domains in said lattice and being movable in said second layer in response to the movement of coupled magnetic domains in said first material,
   a sixth layer comprising means for sensing said second bubble domains in said second layer, said sensing occurring while said first bubble domains are retained in said lattice.

29. The composite structure of claim 28, including means for annihilating second magnetic bubble domains in said second layer.

30. The composite structure of claim 28, further including means for coding said second bubble domains in terms of the presence and absence of said second bubble domains.

31. The composite structure of claim 28, including means for retaining said first bubble domains in said lattice during all operations on domains in said second layer of magnetic material.

* * * * *

UNITED STATES PATENT AND TRADEMARK OFFICE
CERTIFICATE OF CORRECTION

PATENT NO. : 4,052,711

DATED : Oct. 4, 1977

INVENTOR(S) : Lin et al

It is certified that error appears in the above-identified patent and that said Letters Patent are hereby corrected as shown below:

Column 4, line 28, "not" should read --now--.

Column 8, line 53, "waveform" should read --waveforms--.

Column 9, line 8, after "tightly" insert --held--.

Column 9, line 58, after The, "register" should read --registers--.

Signed and Sealed this

Fourth Day of July 1978

[SEAL]

Attest:

RUTH C. MASON
Attesting Officer

DONALD W. BANNER
Commissioner of Patents and Trademarks